United States Patent [19]
Tovim et al.

[11] Patent Number: 5,719,818
[45] Date of Patent: Feb. 17, 1998

[54] ROW DECODER HAVING TRIPLE TRANSISTOR WORD LINE DRIVERS

[75] Inventors: Asaf Ben Tovim, Ra'anana; Yaron Slezak, Kiriat Motzkin, both of Israel

[73] Assignee: Waferscale Integration Inc., Fremont, Calif.

[21] Appl. No.: 634,282

[22] Filed: Apr. 18, 1996

[51] Int. Cl.$^6$ ................................................. G11C 8/00
[52] U.S. Cl. ................... 365/230.06; 365/189.11; 326/106
[58] Field of Search ................... 365/230.06, 203, 365/189.09, 189.11, 230.03; 326/105, 106, 108

[56] References Cited

U.S. PATENT DOCUMENTS

| | | | |
|---|---|---|---|
| 4,724,341 | 2/1988 | Yamada et al. | 307/449 |
| 4,798,977 | 1/1989 | Sakui et al. | 307/446 |
| 4,843,261 | 6/1989 | Chappell et al. | 307/449 |
| 5,018,107 | 5/1991 | Yoshida | 365/230.06 |
| 5,282,175 | 1/1994 | Fujita et al. | 365/230.06 |
| 5,416,741 | 5/1995 | Ohsawa | 365/201 |
| 5,446,859 | 8/1995 | Shin et al. | 395/427 |
| 5,519,665 | 5/1996 | Chishiki | 365/230.06 |

OTHER PUBLICATIONS

"Fast–Access BiCMOS SRAM Architecture with a $V_{ss}$ Generator" by T. Douseki, et al., *The Journal of Solid–State Circuits*, vol. 26, No. 4, Apr. 1991, pp. 513–517.

S.B. Ali et al., "A 50-ns 256k CMOS Split–Gate EPROM", *IEEE Journal of Solid–State Circuits*, vol. 23, pp. 79–85, Feb. 1988.

Katsuyuki Sato et al., "A 4–MB Pseudo SRAM Operating at 2.6 ±1 V with 3–μA Data Retention Current", *IEEE Journal of Solid–State Circuits*, vol. 26, pp. 1556–1561, Nov. 1991.

R. Shirata et al., "An Accurate Model of Subbreakdown Due to Band–to–Band Tunneling and its Application", *Iedm Technical Digest*, pp. 16–17, Dec. 1988.

Tomohisa Wasa et al., "Simple Noise Model and Low–Noise Data–Output Buffer for Ultrahigh–Speed Memories", *IEEE Journal of Solid–State Circuits*, vol. 25, pp. 1586–1588, Dec. 1990.

Manabu Ando et al., "A 0.1–μA Standby–Current, Ground–Bounce–Immune 1–Mbit CMOS SRAM", *IEEE Journal of Solid–State Circuits*, vol. 24, pp. 1708–1710, Dec. 1989.

*Primary Examiner*—David C. Nelms
*Assistant Examiner*—Son Mai
*Attorney, Agent, or Firm*—Skjerven, Morrill MacPherson, Franklin & Friel

[57] ABSTRACT

A row decoder with a novel word-line driver is described. Each driver includes a p-channel select transistor and first and second, significantly separated, n-channel discharging transistors, all of whose drains are connected to the word-line to be controlled. The two discharging transistors are connected in different sections, such as on opposite sides, of the word-line. The driver is controlled by a control line, a select line and a disable line. When the control line is active, it enables the select transistor to select the word-line only if the select line is active. The discharging transistors are controlled through the disable line, discharging the word-lines when the disable line is strobed. In a second embodiment, the disabling activity is segmented such that only one block of the array is discharged at a time. A third embodiment shows the segmentation within an alternate metal, virtual ground array architecture.

11 Claims, 10 Drawing Sheets

ROW DECODER HAVING TRIPLE TRANSISTOR WORD LINE DRIVERS

FIELD OF THE INVENTION

The present invention relates to memory units in general and to word-line decoders for such memory units in particular.

BACKGROUND OF THE INVENTION

Memory units, such as electrically programmable read only memory (EPROM) arrays, electrically erasable programmable read only memory (EEPROM) arrays, flash EEPROM (FLASH) arrays, self-timed random access memory (SRAM) arrays, and dynamic random access memory (DRAM) arrays, are formed of arrays of individually accessible storage units, organized into rows of data attached to a "word-line".

FIG. 1, to which reference is now made, illustrates, in general terms, a memory array 10. The memory array 10 has a plurality of word lines, two of which, labeled WL(N1) and WL(N2), are shown. Attached to each word line are a multiplicity of memory cells to be accessed.

The memory array 10 has an associated X or row decoder unit 12 which, when memory cell must be accessed (for reading, writing or programming purposes), receives an address signal indicating the desired memory cell. The X decoder 12 decodes the address signal to select the unique word-line associated with the desired memory cell. For each word line to be activated, the X decoder 12 typically first deselects (i.e. discharges) the previously selected work line and selects the word line to be activated (i.e. charges it).

X decoders 12 can either be clocked or unclocked. U.S. Pat. No. 4,843,261 to Chappell et al. describes one clocked X decoder. An unclocked architecture deselects the previously selected work line while selecting the newly selected word line. A clocked architecture utilizes less space than an unclocked architecture (and is, therefore, generally more desirable); however, clocked architectures perform the selection and deselection operations in series with each other. Thus, in clocked architectures, the deselection operation must be fully completed before initiating the selection operation.

The time required for deselection or selection depends on the time constant (the "RC" delay) of the word lines. The RC delay is a function of the resistance (R) and capacitance (C) of each word line, both of which are functions of the cross-sectional area and length of each word line. It is noted than, the larger the RC delay is, the longer it takes to discharge or charge the word line.

For low and medium density memory arrays 10, indicated in FIG. 1 by the solid lines, the word lines WL(N1) and WL(N2) are of a length such that their RC delay is relatively low. Thus, the time required to deselect and then select, which occurs each time the word line charges, is acceptable. However, for high density memory arrays, as indicated by the dotted lines, the word lines become quite long and, as a result, have an increased RC delay. Every X nanoseconds increased RC delay causes a 2× increased word line access time (comprised of deselection and selection), which can be unacceptably long.

The article, "Fast-Access BiCMOS SRAM Architecture with a $V_{SS}$ Generator" by T. Douseki, et al., *The Journal of Solid-State Circuits*, Vol. 26, No. 4, April 1991, pp. 513–517, describes a high density (256 Kb) SRAM device. In order to get the fast access, the authors did many things, including segmenting the memory array into a number of sections, each having its own X decoder. This is illustrated in FIG. 2 where each word line is divided into two sections, each controlled by a separate X decoder. By doing segmentation, the resistance R is reduced by a factor of 2 as is the capacitance C. Thus, segmentation reduces the RC delay by a factor of 4. Unfortunately, such a solution is expensive in silicon area, since an extra X decoder is required.

Alternatively and as known in the prior art, the word lines can be strapped with metal (whose resistance value is significantly lower than that of the word lines and hence, its RC delay is much improved). Unfortunately, in current dense architectures, the pitch (or width) of metal lines is wider than that of the word lines and thus, though it provides a faster selection time, strapping the word lines with metal adds significant amounts of area to the chip.

SUMMARY OF THE PRESENT INVENTION

The present invention is a clocked row decoding unit which is operative with long word lines. It includes strobed block decoders on one side of the word lines and a segmented strobe line on the other side of the word lines.

There is therefore provided, in accordance with a preferred embodiment of the present invention, a row decoder for controlling a plurality of selectable word-lines which includes a row decoder disable line, at least one control line strobed by the row decoder disable line and a multiplicity of triple transistor word-line drivers, wherein each word-line driver controls a single word-line. Each word-line driver includes a p-channel charging transistor and first and second, significantly spatially separated, n-channel discharging transistors. Each of the transistors is connected to the single word-line and the charging transistors and the first discharging transistor are controlled by one of the control lines and the second discharging transistor is controlled by the row decoder disable line. The first discharging transistors are activatable with the second discharging transistors.

Additionally, in accordance with a preferred embodiment of the present invention, the first and second discharging transistors are located on opposite ends of their corresponding word-line.

Moreover, in accordance with a preferred embodiment of the present invention, the entirety of the second discharging transistors are connected to the row decoder disable line.

Further, in accordance with a preferred embodiment of the present invention, the row decoder also includes discharge segmenting elements for grouping the second discharging transistors thereby to discharge only one group of the second discharging transistors at a time. The discharge segmenting elements include a plurality of decoded segmenting control lines, a delay unit for delaying the signals on the control lines and a NOR gate per segmenting control line wherein each the NOR gate is connected, on input, to the complemented output of one delay unit and to the complement of the row decoder disable line and, on output, to a group of second discharging transistors.

Still further, in accordance with a preferred embodiment of the present invention, the row decoder of the present invention can be operative for an alternate metal, virtual ground type array having a multiplicity of select control lines for segmenting the array, wherein each segment has two types of select control lines. In this embodiment, the discharge segmenting elements include, per segment, a) apparatus for determining when the select control lines have activated a corresponding segment and b) apparatus for activating the second discharging transistors of the segment only when the output of the means for determining indicates activated segment select lines and the row decoder disable line is active.

Moreover, in accordance with a preferred embodiment of the present invention, the apparatus for determining includes a first NOR gate connected to the corresponding segment select lines and a delay unit for delaying the output of the first NOR gate, and the apparatus for activating includes a second NOR gate connected to the output of the first NOR gate and a line having the complement of the signal on the row decoder disable line. Alternatively, the input to the second NOR gate can include a line having a delayed complement of the signal on the row decoder disable line.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Some memory arrays have long word-lines which, due to their length, have long RC delays. When such arrays utilize any of the word-line drivers of the prior art, they take a relatively long time to charge and discharge.

Figure 1:
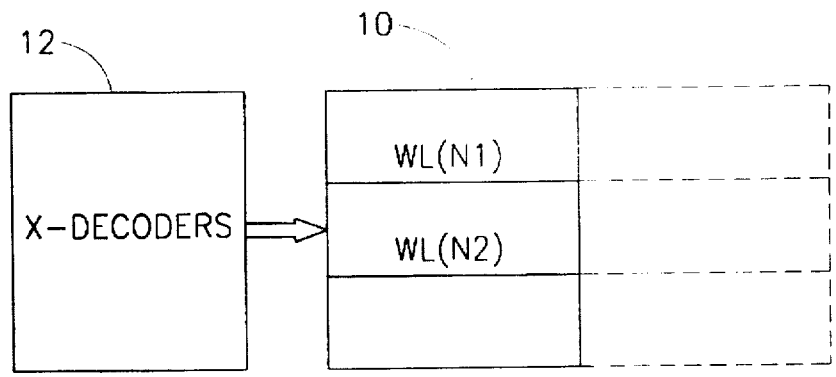
FIGS. 1 and 2 are schematic illustration of prior art memory arrays with X decoders.
Figure 2:
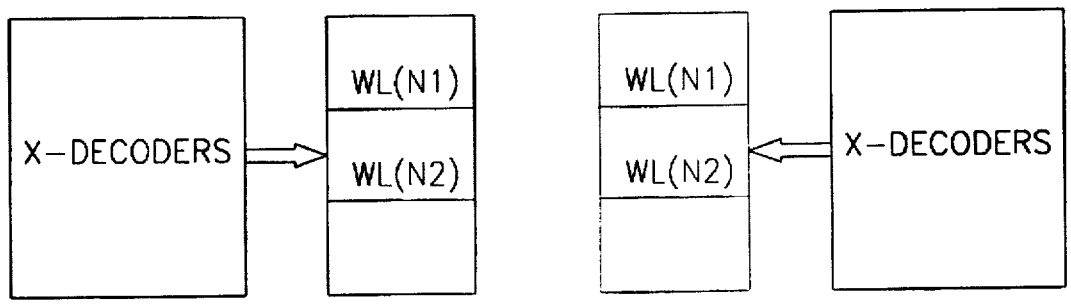
Figure 3:
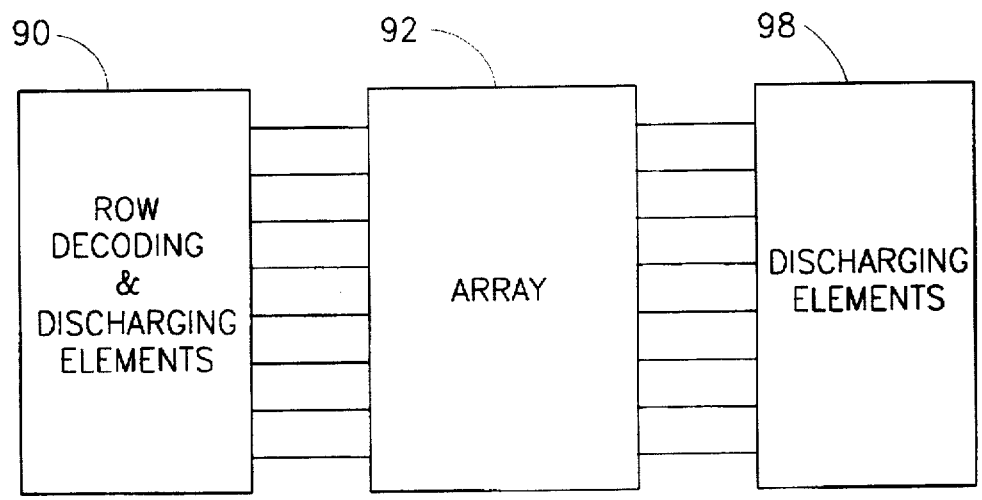
FIG. 3 is a schematic illustration of the elements of an array with integrated word-line drivers, constructed and operative in accordance with an embodiment of the present invention.
Figure 4:
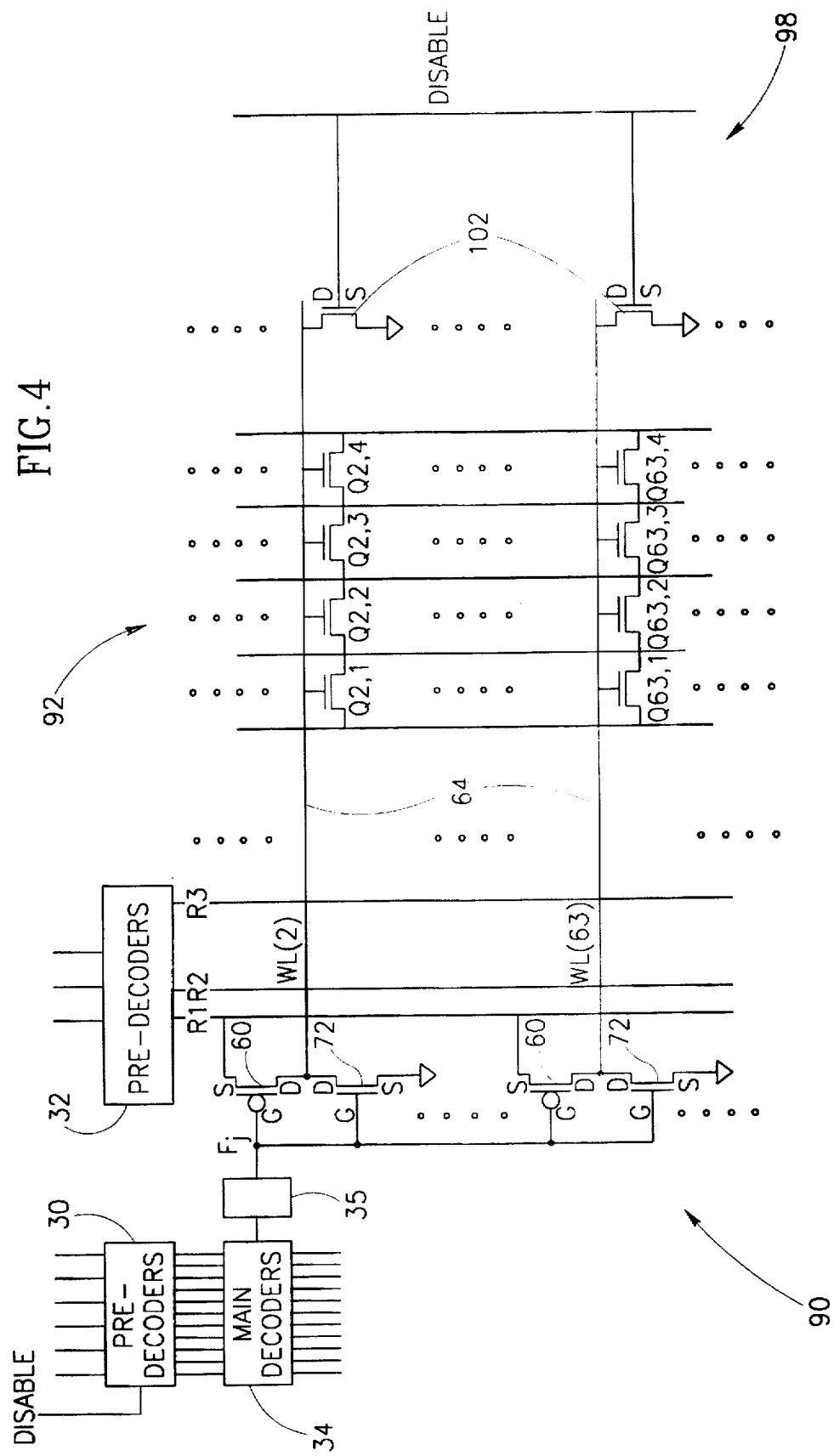
FIG. 4 is a circuit diagram illustration of the array of FIG. 3.
Figure 5:
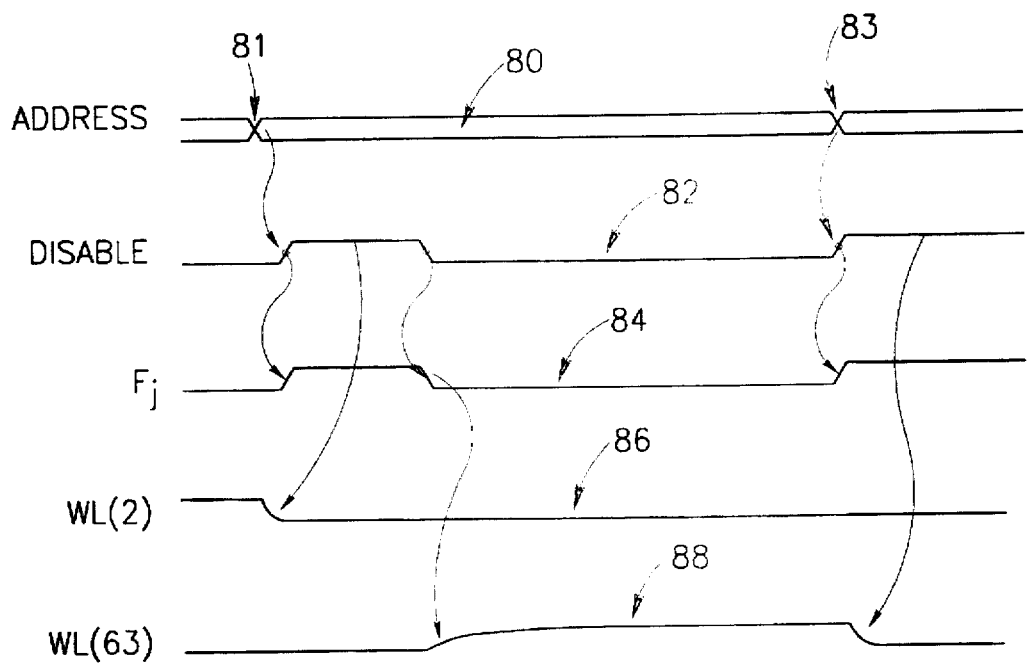
FIG. 5 is a timing diagram for the word-line drivers of FIG. 4.

Reference is now made to FIGS. 3, 4 and 5 which illustrate a clocked row decoder of the present invention which reduces the time to discharge. FIG. 3 illustrates the overall structure of the array with the decoding elements of the present embodiment, FIG. 4 details the array circuitry and FIG. 5 is a timing diagram for the present embodiment.

FIG. 3 illustrates the overall structure of the array. It includes row decoding and discharging elements 90, the array 92 itself and discharging elements 98. In accordance with the present invention, the discharging elements 98 are located on the opposite side of the array 92 from the row decoder elements 90, as will be described in more detail hereinbelow.

The row decoder part of elements 90 of FIG. 4 includes the following elements: two types of predecoders 30 and 32, main decoders 34 and isolation and voltage translation elements 35, all of which control word lines 64. The main decoder 34 supplies a control line Fj which controls a block of word-lines 64. In accordance with the present invention, the predecoders 32 are connected through select lines Ry to the word lines 64. The select lines Ry provide the final decoding for the block decoded by the Fj signal.

In accordance with a preferred embodiment of the present invention, the row decoding elements additionally include one p-channel charging transistor 60 per word-line 64. The drain node D of each charging transistor 60 is connected to its corresponding word-line 64 and the gate nodes G of the charging transistors 60 are connected to the control line Fj. The source node S of each charging transistor 60 is connected to one of the predecoder select lines Ry.

FIG. 4 shows the elements of array 92 for an exemplary array. The array includes a multiplicity of transistors Q(x,y) divided into many columns, each having N transistors therein. The transistors Q(x,y) are also arranged into rows, where each row of transistors Q(x,y) are connected to a single word line 64.

In accordance with the present invention and as shown in FIG. 4, the discharging elements for each word-line 64 consist of two n-channel discharging transistors 72 and 102, respectively located on separate sides of each word-line 64, and a DISABLE line, connected both to predecoders 30 and to the discharging transistors 102. Discharging transistors 102 and the DISABLE line form part of the discharging elements 98 and discharging transistors 72 form the discharging part of elements 90. The drain node D of each discharging transistor 72 and 102 is connected to its corresponding word-line 64. The source nodes S of all of the discharging transistors 72 and 102 are connected to ground. The gate nodes G of the discharging transistors 72 are connected to the control line Fj while the gate nodes G of the discharging transistors 102 are directly connected to the DISABLE line. The DISABLE line is a clock signal (which can be an address transition detected signal) and is active, as described hereinbelow, during periods when word selection is not desired.

Since the array transistors Q(x,y) of each row are connected to the word-line between the two discharging transistors 72 and 102 and since the two discharging transistors 72 and 102 are activated at the same time, as described in detail hereinbelow, each word-line 64 is discharged through two, spatially separated transistors.

The spatial separation of discharging transistors 72 and 102 provides two separate discharge paths for the charge on the relevant word-line. The two separate discharge paths, in effect, divide each word line in two. Thus, for discharging, the RC delay of the word line is that of a word line of half the length. The result is that the two discharging transistors 72 and 102 discharge, by a factor of 4, more effectively than would a single discharging transistor 72 or 102 or almost any size at only one end of the word line.

It will be appreciated that the spatial separation of the present invention provides word-line "division" without the attendant X-decoding which was present in the prior art. The discharging elements 98 in FIG. 4 comprise the DISABLE line and one transistor 102 per word-line, a relative small increase in decoding overhead. Thus, the present invention reduces discharge time without the attendant increase in area on the chip.

It will be appreciated that each charging transistor 60 and its two associated, spatially separated, discharging transistors 72 and 102 together form a word-line driver. The charging transistor 60, when activated, selects the word-line and the two discharging transistors 72 and 102 deselect the word-line.

As mentioned hereinabove, there are two phases to accessing a word-line, word-line deselection and word-line selection, and they occur one after the other. These phases are shown through the signals of FIG. 5 which include the address select signal 80, the DISABLE signal 82, the control signal 84 on line Fj and the resultant signals 86 and 88 on two word lines, WL(2) and WL(63), respectively. FIG. 5 shows that word line WL(2) is initially selected after which word line WL(63) is selected.

When a new address is received, as indicated by the cross 81 of signal 80, the entire array of word-lines are first deselected after which the desired word-line is selected. Thus, the new address signal causes the DISABLE signal to be activated and the deselection to occur. Activation of the DISABLE line causes a) the control line Fj to become logically high (as seen in signal 84) and to thereby activate all the discharging transistors 72 and b) activation of the entirety of the discharging transistors 102. As a result of the activation of the two groups of discharging transistors 72 and 102, all of the word-lines 64 begin to be discharged. As shown in FIG. 5, signal 88 (of WL(2)) begins to discharge as a result of the activation of the DISABLE signal 82.

As mentioned hereinabove and as shown by signal 86, since there are two discharge paths for each word-line, through each of the discharging transistors 72 and 102, the discharge time is significantly reduced. The discharge time is a factor of four faster than for a single discharging transistor on one side of the word line.

Word-line deselection ends with the clocked return of the DISABLE signal to its logical low state. At that point, the main decoder 34 supplies a logic low voltage (Fj low) to the gates G of all of its charging and discharging transistors 60 and 72, respectively. This activates the corresponding charging transistors 60 and disables the corresponding discharging transistors 72.

The charging transistors 60 are activated to pass the voltages on the select lines Ry to the corresponding word-lines 64. At any time, only one of the predecoded select lines Ry is at a logic high level. The remaining select lines Ry are at a logic low level, as described hereinabove. The voltage levels of the word-lines 64 become the voltage levels passed by the select lines Ry and thus, the only activated word-line 64 is the one in the block whose Ry line has a logic high level. During selection, the discharging transistors 72 of the block, which are n-channel transistors, are inactivated, as are the discharging transistors 102.

Signal 88 of WL(63) rises in response to the activation of signal 84. Note that the rise time of WL(63) is slower than the discharge time of WL(2) (signal 86) due to the presence of only one transistor 60 on only one side of word line 63.

When the next address signal arrives, marked by cross 83, word-line WL(63) is discharged as described hereinabove for word-line WL(2).

It is noted that the DISABLE line, in the embodiment of FIG. 4, is a single line connected to all of the rows of the array. For small arrays, this is acceptable. However, for large arrays the DISABLE line is quite long and, therefore, its capacitance and power dissipation become significant.

One solution, shown hereinbelow in FIGS. 6, 7A, 7B and 8 to which reference is now made, is to segment the DISABLE line. Thus, only portions of the DISABLE line are activated at a time. This reduces the active capacitance of the DISABLE line, thereby reducing the power consumption of the line. The segmentation of the DISABLE line causes the discharging transistors 102 to be controlled in groups. The groups can be the size of a block or the size of many blocks, as desired.

Figure 6:
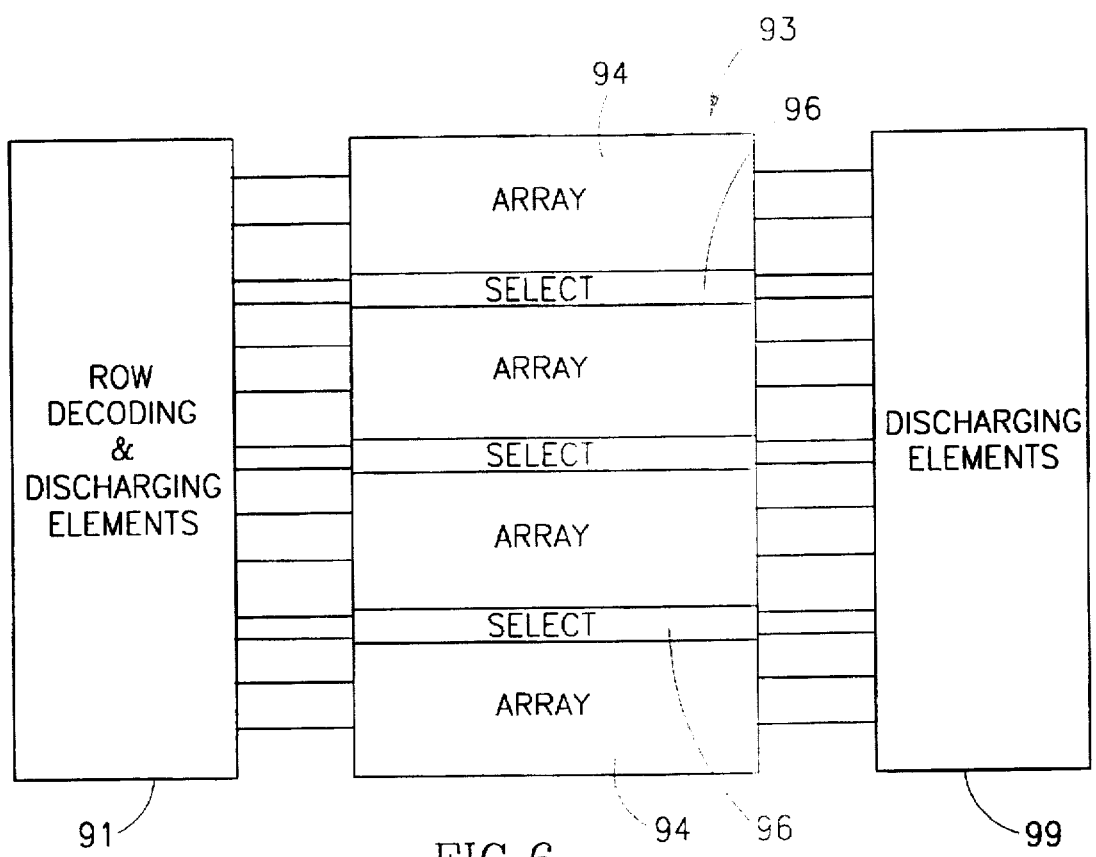
FIG. 6 is a schematic illustration of the elements of an array with integrated word-line drivers, constructed and operative in accordance with a second embodiment of the present invention.
Figure 7A:
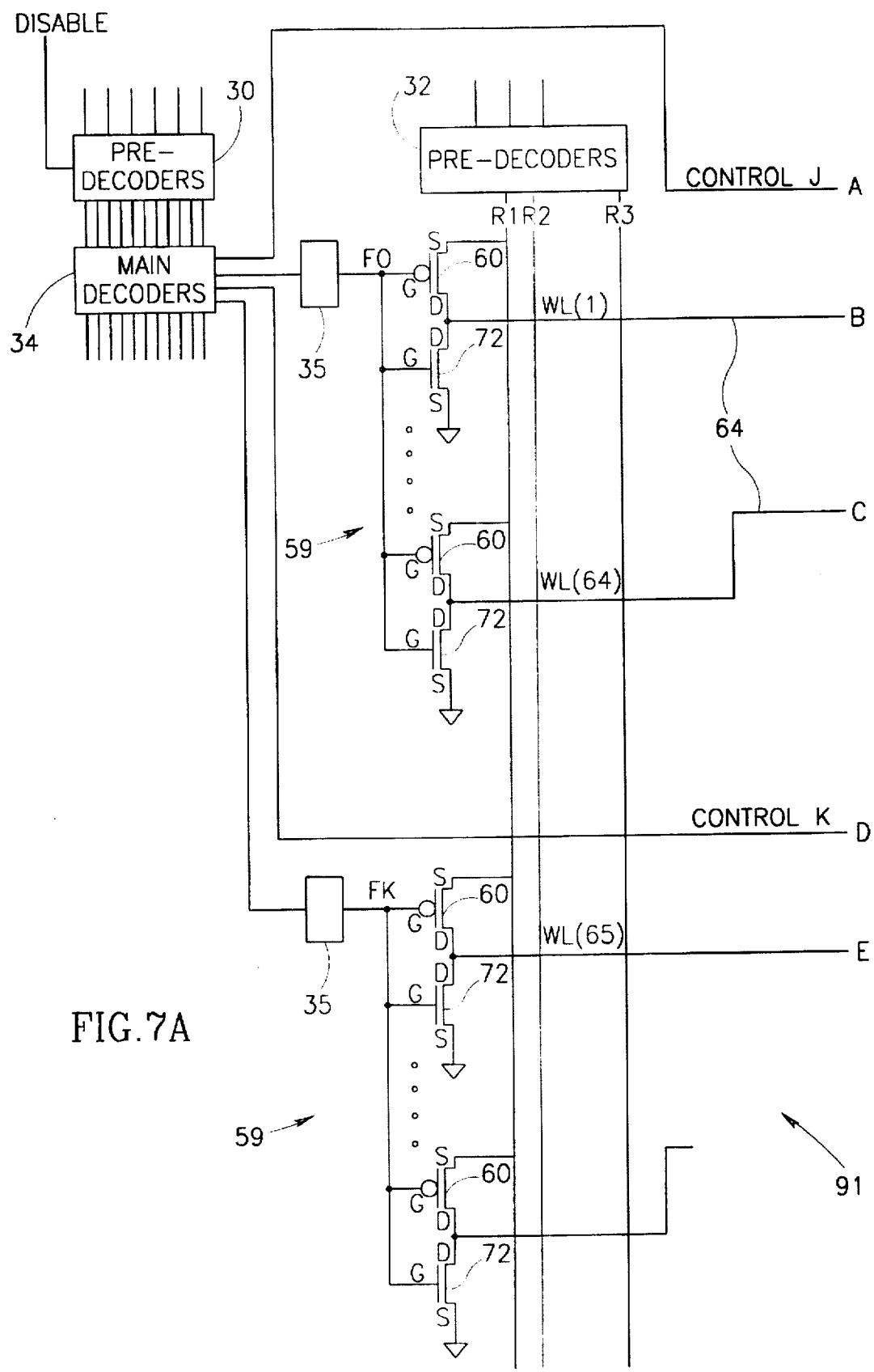
FIGS. 7A and 7B together form an alternative circuit diagram illustration of the array of FIG. 6.
Figure 7B:
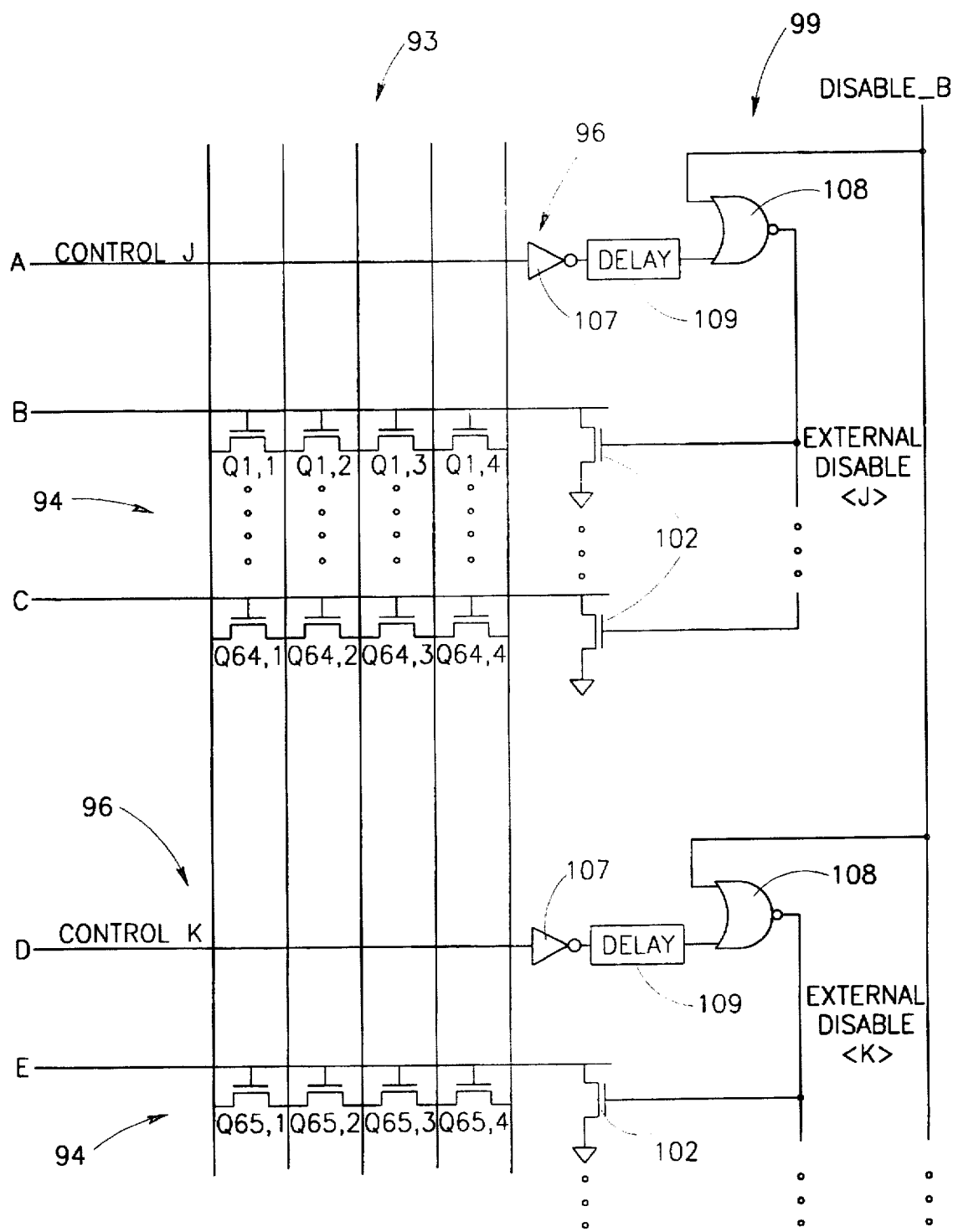
Figure 8:
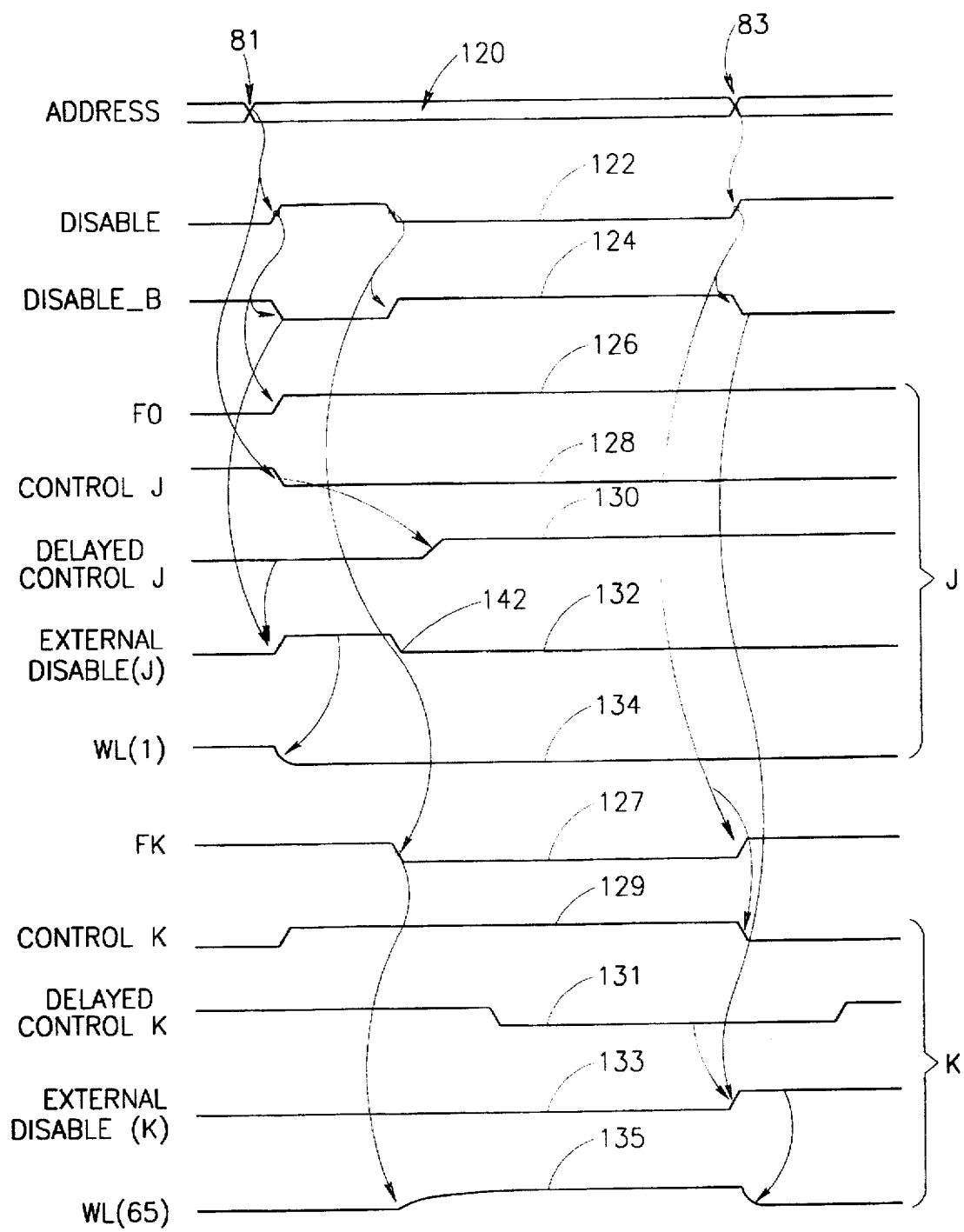
FIG. 8 is a timing diagram for the word-line drivers of FIGS. 7A and 7B for two different transitions.

FIG. 6 illustrates the general structure of the array and FIGS. 7A and 7B are circuit diagrams of the array and the row decoding elements. FIG. 8 provides timing diagrams for a transition between word-lines of different groups.

FIG. 6, which is similar to FIG. 3, illustrates the overall structure of the array. It includes row decoding and discharging elements 91, the array 93 itself, which, in this embodiment, comprises array portions 94 and select portions 96, and discharging elements 99. As in the previous embodiment, the discharging elements 99 are located on the opposite side of the array 93 from the row decoder elements 91.

FIGS. 7A and 7B detail the array and are similar to FIG. 4. Similar elements have similar reference numerals. In this embodiment, control lines, such as CONTROL J and CONTROL K, are added as output of the main decoders 34 to segment the discharging elements 99. FIGS. 7A and 7B illustrate that there is one CONTROL line per block 59. This is for illustration only; other embodiments envision one CONTROL line per a plurality of blocks 59.

As in the previous embodiment, the row decoder part of elements 91 include the following elements: two types of predecoders 30 and 32, main decoders 34, isolation and voltage translation elements 35, and one p-channel select transistor 60 per word-line 64, connected as in the previous embodiment. FIG. 7A shows a second block 59 controlled by an Fk signal, also generated by the main decoders 34.

As shown in FIG. 7B, the discharging elements 99 additionally include one inverter 107, a delay element 109, such as a capacitor or a latch, and grouping NOR gate 108 per segment of the array and connected in series to one CONTROL line per segment of the array. The inverters 107 invert the CONTROL signal, the delay elements 109 delay the CONTROL signal, producing a DELAYED CONTROL signal, and each grouping NOR gate 108 activates only a segment of the discharging transistors 102, depending on the state of the DELAYED CONTROL signal. Each grouping NOR gate 104 is connected to the output of its delay element 109 and to a DISABLE_B signal (the complement of the DISABLE signal provided to the predecoders 30). The output line of the NOR gate 108 is denoted the EXTERNAL DISABLE(i) line, where i is the number of the segment being controlled.

To understand the operation of this embodiment, consider the timing diagrams of FIG. 8 and the previous discussion. In FIG. 8, the signal 120 indicates the address selection signal, signals 122 and 124 indicate the activity of the DISABLE and its complement, the DISABLE_B, signals, respectively, signal 126 indicates the activity of the control signal F0, signals 128 and 129 indicate the activity of the CONTROL(J) and CONTROL(K) lines of the two segments, signals 130 and 131 indicate the activity of the DELAYED CONTROL(J) and DELAYED CONTROL(K) lines of the two segments, signals 132 and 133 indicate the activity of the EXTERNAL DISABLE(J) and EXTERNAL DISABLE(K) signals respectively provided to the two groups of discharging transistors 102, and the signals 134 and 135 indicate the charge on the word-line WL(1) of the upper segment (which is initially charged) and on word-line WL(65) of the lower segment (which is selected), respectively.

Initially, word line WL(1) is read. When a new address signal is received, as indicated by the cross 81 of signal 120, the DISABLE signal is activated and its complement DISABLE_B is deactivated. Activation of the DISABLE line causes a) all control line F0 to become logically high and to thereby activate all the discharging transistors 72 and b) the DISABLE_B signal provides a low signal to each of the NOR gates 108. The CONTROL(J) signal also becomes low at this time, while the remaining CONTROL signals, such as CONTROL(K), become high. The DELAYED CONTROL(J) (which is the delayed inverse of the CONTROL(J) signal) remains low for some time, becoming high a few nanoseconds after CONTROL(J) becomes low. Typically the delay is of a few nanoseconds (i.e. the same order of magnitude as the word line RC delay). Similarly, the DELAYED CONTROL(K) signal is initially high and becomes low some time after the CONTROL(K) signal becomes high.

Since the DISABLE_B and DELAYED CONTROL(J) signals are both low, the NOR gate 108 activates the EXTERNAL DISABLE(J) signal, as seen in signal 132. No such activation occurs to EXTERNAL DISABLE(K) (signal 133) since DELAYED CONTROL(K) is still high. The activation of the EXTERNAL DISABLE(J) signal activates the discharging transistors 102 of group J only. Thus, the activation of the DISABLE signal causes the discharge only of the word-lines of the currently active group, group J. This is shown in FIG. 8 on signal WL(1) which discharges, at a fairly fast rate, as a result of the activation of the EXTERNAL DISABLE(J) signal. Word-line WL(65) (of group K), which was not selected, remains discharged.

The CONTROL and DISABLE lines are clocked lines which change state after a given period of time. Once either DELAYED CONTROL(J) becomes high (due to its delayed response to CONTROL(J) or DISABLE_B becomes high )due to the clocking of the DISABLE line), the EXTERNAL DISABLE(J) line becomes low (as marked at point 142). This ends the deselection of group J.

With the change of state of the DISABLE line, the control line Fk changes state, thereby charging, at a relatively slow rate, the newly selected word-line WL(65).

FIG. 8 also illustrates the discharging of work line WL(65) which occurs at the next clocking of the disable line, in a manner similar to that for the discharge of word line WL(1).

It will be appreciated that, since the EXTERNAL DISABLE signals are dependent on the status of their input CONTROL(I) lines, the only word lines which will be discharged when DISABLE_B goes high are those in the portion of the array controlled by the active CONTROL(I) line.

It will further be appreciated that the timing of the EXTERNAL DISABLE signals is dependent only on the DISABLE_B timing since the DELAYED CONTROL signals, due to their delayed operation, maintain the same state throughout the period that the DISABLE_B is active.

A similar operation occurs when a word-line within the currently selected group is selected. For this operation, the CONTROL(i) signal remains high during the selection of the next word-line within the same group while the DISABLE_B line becomes high at the end of the deselection. The remaining operations stay the same.

Figure 9A:
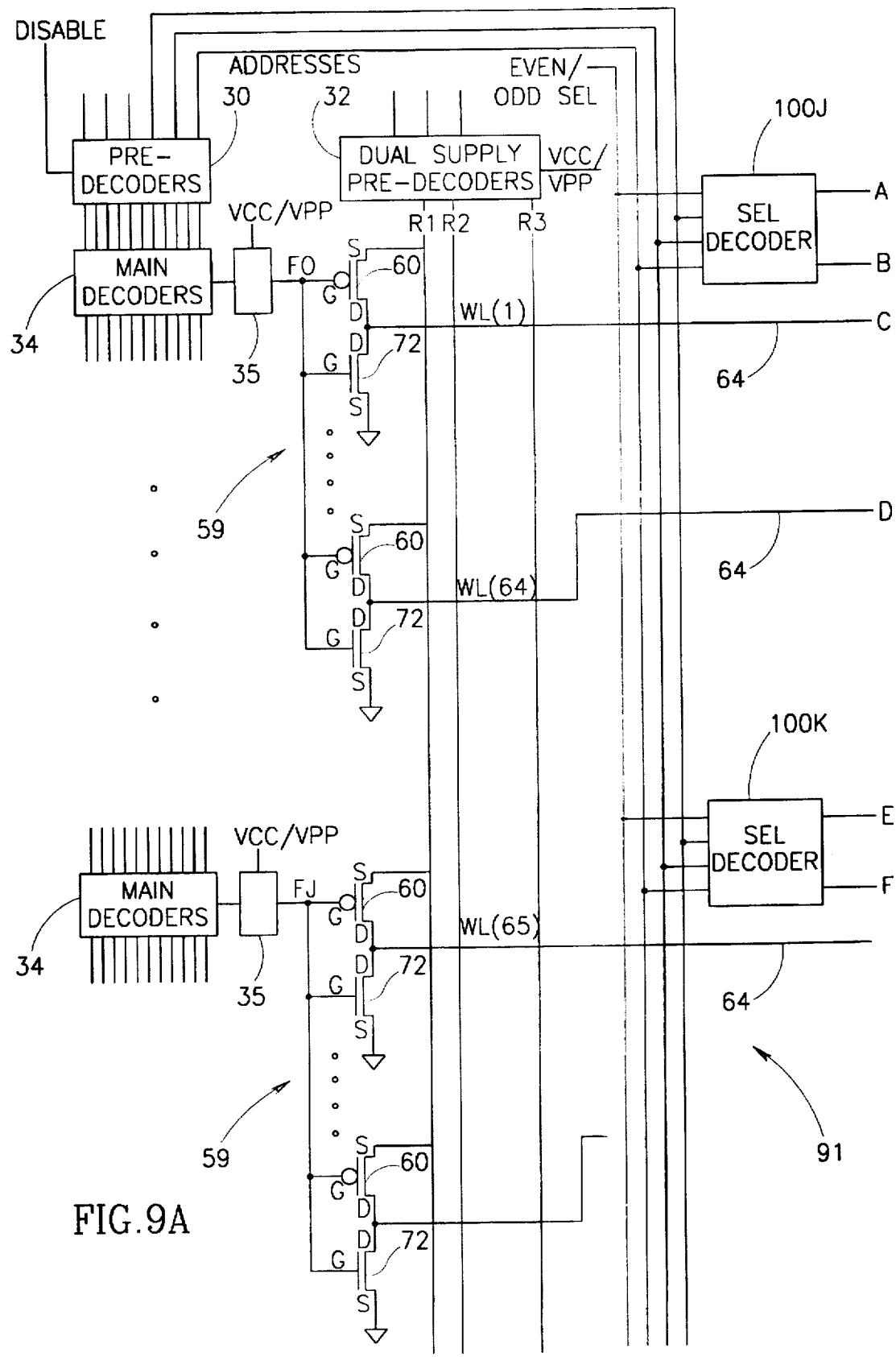
FIG. 9A and 9B together form a further alternative circuit diagram illustration of the array of FIG. 6 implemented in an alternate metal, virtual ground architecture.
Figure 9B:
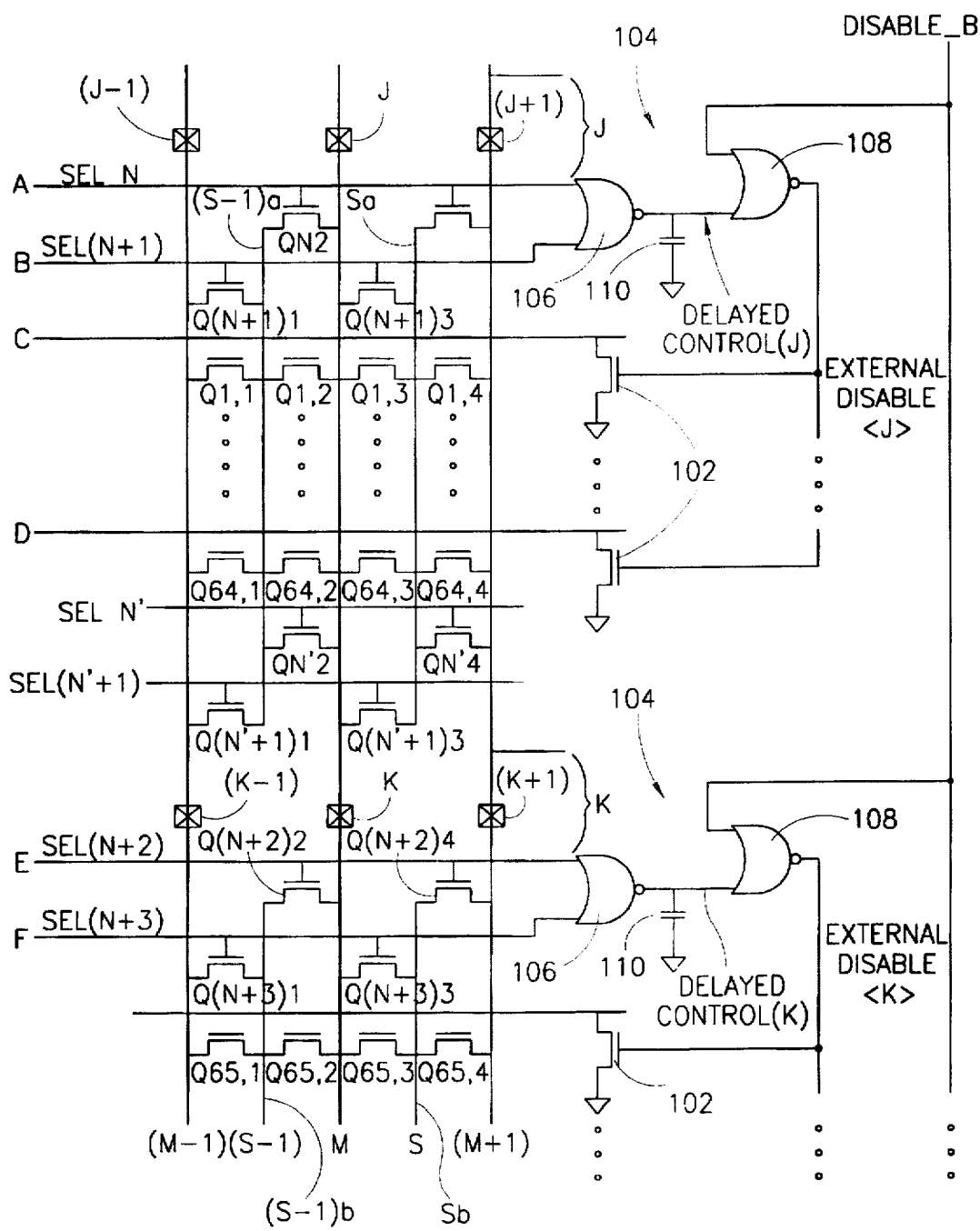

Reference is now briefly made to FIGS. 9A, 9B, 10A and 10B which illustrate the segmentation operation of the previous embodiment as implemented in an alternate metal, virtual ground array. FIG 9B shows the elements of array 91 for an exemplary alternate metal, virtual ground array. The array includes a multiplicity of transistors Q(x,y) segmented into many columns, each having 64 transistors therein. Each column is controlled by two select transistors Qij, one at the top and one at the bottom of the column. The select transistors of the top and of the bottom are organized into two separate rows, controlling the even and odd transistors of the array. The select transistors are controlled by select word-lines labeled SEL N, SEL N+1 for the top two rows and SEL N' and SEL N'+1 for the corresponding bottom two rows.

The present embodiment utilizes the select lines to create the DELAYED CONTROL signals of the previous embodiment. It also shows a plurality of main decoders 34 which activate only one block of word-lines 64 at a time. Each main decoder 34 supplies a control line Fx to a block 59 which, in response, control their associated word-lines 64. Otherwise, the transistors 60, 72 and 102 are connected as in the previous embodiment.

In this third embodiment, the row decoder elements 91 additionally comprise select decoders 100 which control select lines SEL(N+1) shown in FIG. 9A and which divide the array, for discharging purposes, into blocks, such as blocks J and K. The select decoders 100 receive the address signals provided to pre-decoders 30 as well as an even/odd SEL signal indicating whether to activate the even or odd SEL line.

As shown in FIG. 9B, the discharging elements 99 are similar to those of FIG. 7B with the addition of NOR gate 106 and capacitor 110. NOR gate 106 is connected to the two SEL lines and determines whether or not the particular block has been activated for reading. If so, NOR gate 106 creates a precursor to the DELAYED CONTROL signal. The precursor signal changes state as soon as an address signal is received.

Capacitor 110 is connected in parallel to the output of NOR gate 106 and is operative to delay the output of the NOR gate 106 so that the DELAYED CONTROL signal changes state a predetermined amount of time after the SEL lines change state. This ensures that the timing of the discharge operation is a function only of the DISABLE_B signal and not of the SEL signals.

The operation of the array of FIGS. 9A and 9B will be described in detail with reference to the timing diagrams of FIGS. 10A and 10B. Many of the signals are the same as in FIG. 8 and therefore, they have the same reference numerals. The new signals are those of SEL(N) (signal 140) and SEL(N+2) (signal 141).

Initially, word-line WL(1) is read and, thus, select control line SEL(N) (signal 140) is active. When a new address signal is received, as indicated by the cross 81 of signal 120, the DISABLE signal is activated (and its complement DISABLE_B is deactivated) and the active select lines are deactivated. Activation of the DISABLE line causes a) all control lines Fx to become or remain logically high (as seen in signals 126 and 127, respectively) and to thereby activate all the discharging transistors 72 and b) the DISABLE_B signal to provide a low signal to each of the NOR gates 108.

Each NOR gate 106 compares its two input select lines. If, as for block J, one of the SEL lines (e.g. SEL(N)) is initially active, NOR gate 106 causes the DELAYED CONTROL(J) line to have a low signal. Otherwise, when neither select line is activated (as in block K), the DELAYED CONTROL(K) line has a high signal. Thus, signal 130 of DELAYED CONTROL(J) is low and signal 131 of DELAYED CONTROL(K) is high.

Since DELAYED CONTROL(J) is low and the DISABLE_B signal just became low, the NOR gate 108 activates the EXTERNAL DISABLE(J) signal, as seen in signal 132. No such activation occurs to EXTERNAL DISABLE(K) (signal 133). The activation of the EXTERNAL DISABLE(J) signal activates the discharging transistors 102 of group J only. Thus, the activation of the DISABLE signal causes the discharge only of the word-lines of the currently active group, group J. This is shown in FIG. 10A on signal WL(1) which begins to discharge as a result of the activation of the EXTERNAL DISABLE(J) signal. Word-line WL(65) (of group K) which was not selected remains discharged.

The select line SEL(N) is deactivated as a result of the address signal but this occurs after the DISABLE line is activated and before it is deactivated. The deactivation of SEL(N) (at point 138) should cause the DELAYED CONTROL line (via NOR gate 106) to become high. However, since capacitor 110 is connected to the CONTROL line, the change takes some time to occur. Thus, DELAYED CONTROL(J) rises at point 139, some time after point 138 at which the SEL(N) line changed voltage. Once DISABLE_B becomes high (the delay is designed to ensure that, DELAYED CONTROL(J) becomes high occurs only after the return of DISABLE_B to the high state), the EXTERNAL DISABLE(J) line becomes low. This ends the deselection of group J.

When select line SEL(N) is deactivated, the new select line, in this example SEL(N+2) (signal 141), is activated. Due to the capacitor 110, the DELAYED CONTROL(K) line becomes low some time after the activation of the SEL(N+2) line. No discharge of block K occurs since DISABLE_B is forced high before DELAYED CONTROL (K) becomes high.

The charging of the newly selected word-line WL(65) does not begin until DISABLE line goes low again (see signal 122) and the new control signal FJ becomes low (see signal 127).

It will be appreciated that, since the EXTERNAL DISABLE signals are dependent on the status of their input SEL(N+i) lines, the only word lines which will be discharged when DISABLE_B goes high are those in the portion of the array controlled by the SEL(N+1) lines.

A similar operation occurs when a word-line within the currently selected group is selected. For example, word-line WL(64) might be selected after WL(1) is selected, both of which are from group J. FIG. 10B illustrates the signals for such a situation.

Figure 10A:
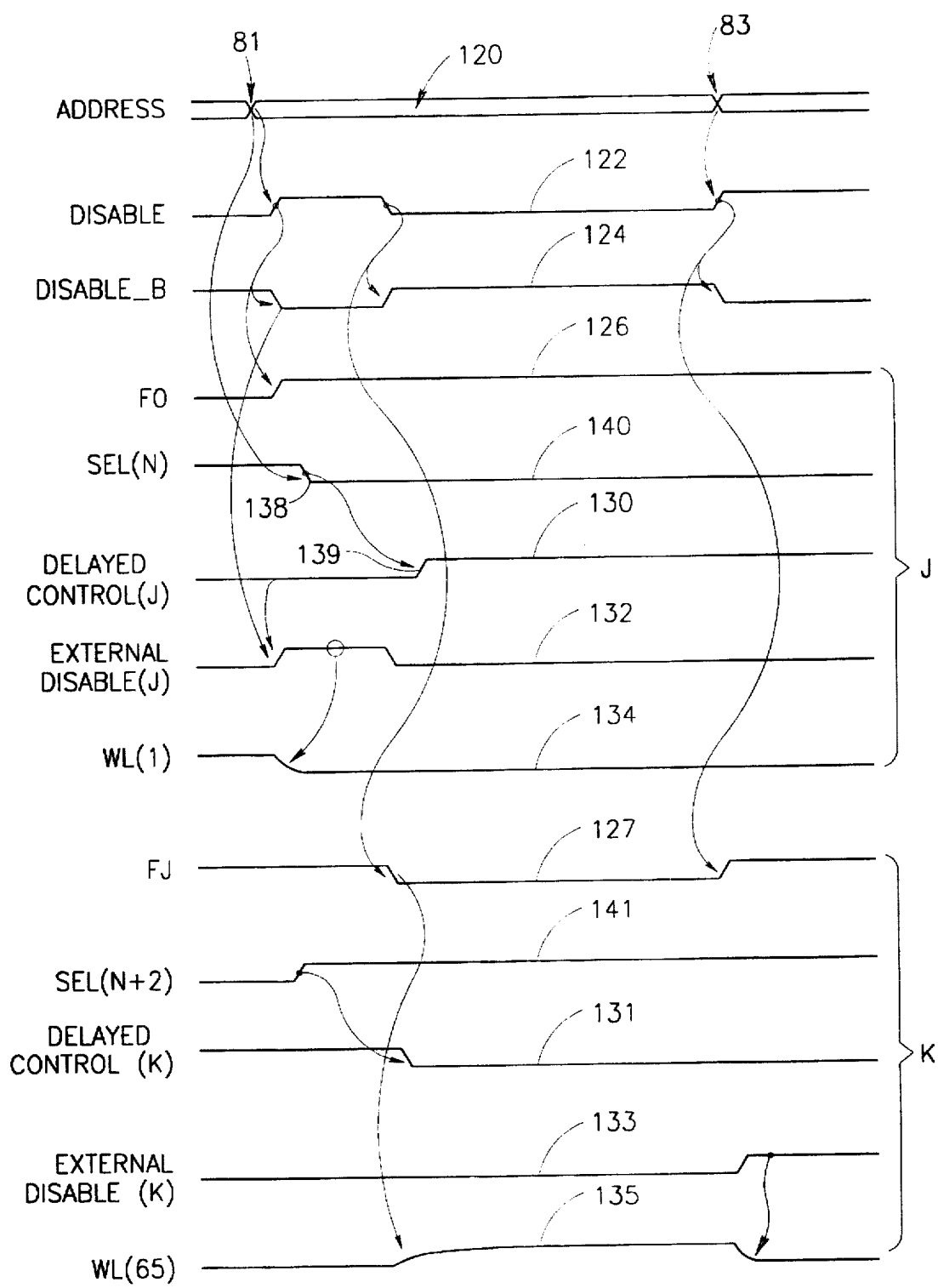
FIGS. 10A and 10B are timing diagrams for the word-line drivers of FIG. 9A and 9B for two different transitions.
Figure 10B:
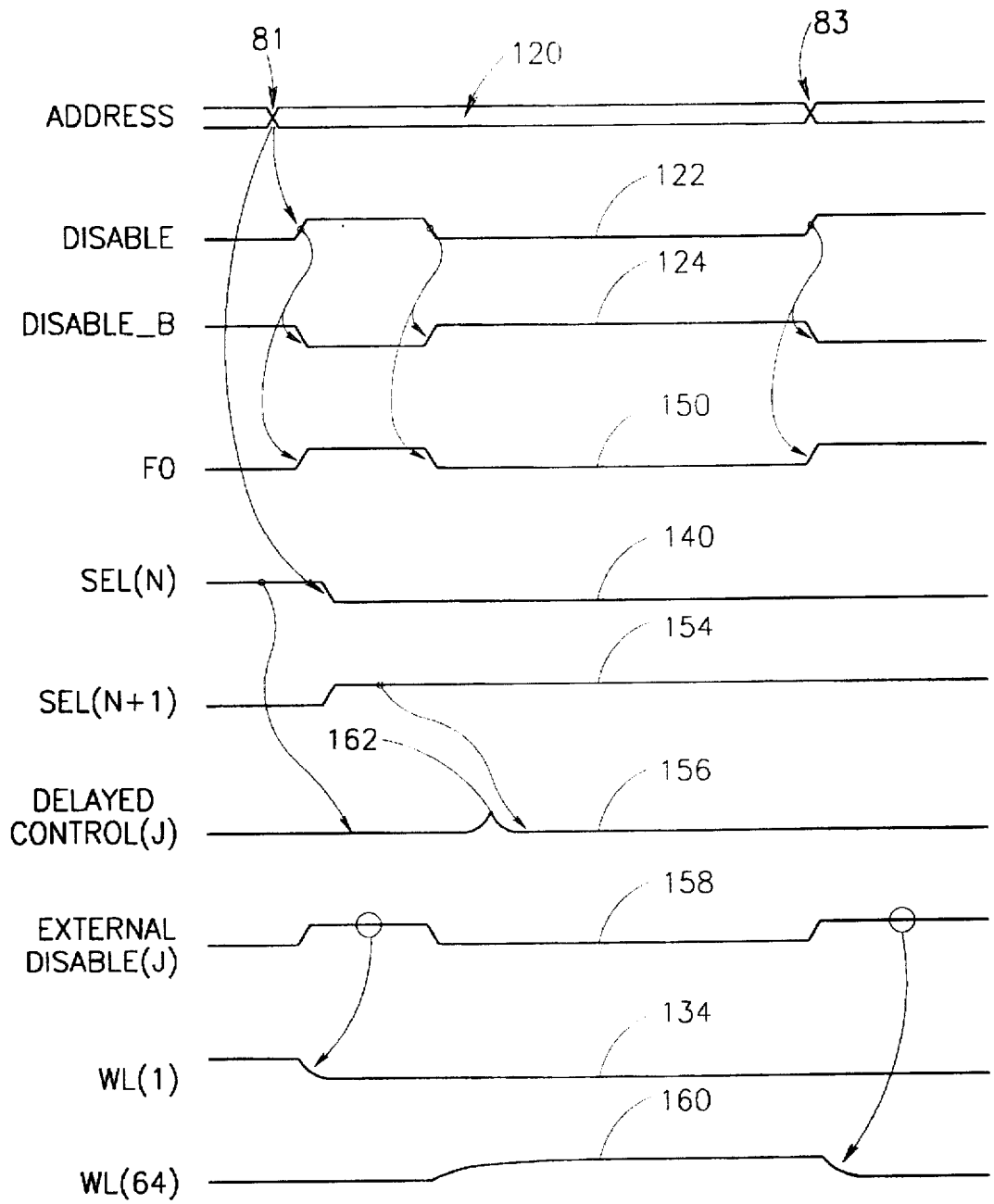

In FIG. 10B, many of the signals are the same as in FIG. 10A and therefore, they have the same reference numerals. The new signals are those of F0 (signal 150), SEL(N+1) (signal 154), DELAYED CONTROL(J) (signal 156), EXTERNAL DISABLE(J) (signal 158) and WL(64) (signal 160).

The operation is similar to that described hereinabove. Initially, word-line WL(1) is being read and, thus select control line SEL(N) is active. When a new address signal is received, as indicated by the cross 81 of signal 120, the DISABLE signal is activated (and its complement DISABLE_B is deactivated) and the active select lines are deactivated. Control line F0 becomes logically high which activates all the discharging transistors 72. The DISABLE_B signal provides a low signal to each of the NOR gates 108. Since SEL(N) is active, NOR gate 106 causes the DELAYED CONTROL(J) line to have a low signal.

Since DELAYED CONTROL(J) is low and the DISABLE_B signal just became low, the NOR gate 108 activates the EXTERNAL DISABLE(J) signal, as seen in signal 158, causing the discharging transistors 102 of group J to discharge the word-lines of group J. Word-line WL(64), which was not selected, remains discharged.

The select line SEL(N) is deactivated as a result of the address signal at which point the SEL(N+1) line (signal 154) is activated. Thus, the DELAYED CONTROL line (via NOR gate 108) stays generally low. In fact, since the two lines do not change voltage levels instantly, there is a very short period of time during which the CONTROL line begins to rise (see point 162) in response to the deactivation of SEL(N). Since SEL(N+1) is activated thereafter, the DELAYED CONTROL(J) line falls. Thus, essentially, the DELAYED CONTROL(J) line remains low, as mentioned hereinabove.

Once the DISABLE_B line goes high, the EXTERNAL DISABLE(J) line becomes low. This ends the deselection of group J. Word-line WL(64), which is selected by SEL(N+1), is now charged.

It will be appreciated that, in all of the embodiments, the control lines Fi control the activation of discharging transistor 72 while the DISABLE_B line controls the activation of discharging transistor 102. In some systems, the control line Fi responds to the address signal slower than does the DISABLE_B signal, due to the many levels of decoding present before the control line Fi. In such systems, it is advantageous to artificially delay the DISABLE_B line so that the DISABLE_B line transitions with the control lines Fi.

It is noted that the elements of the present invention are manufactured using standard CMOS techniques.

It will be appreciated by persons skilled in the art that the present invention is not limited to what has been particularly shown and described hereinabove. Rather, the scope of the present invention is defined only by the claims which follow:

We claim:

1. A row decoder for controlling a plurality of selectable word-lines, the row decoder comprising:
   a row decoder disable line;
   at least one control line strobed by said row decoder disable line; and
   a multiplicity of triple transistor word-line drivers, wherein each word-line driver controls a single word-line and each word-line driver includes:
      a p-channel charging transistor; and
      first and second, significantly spatially separated, n-channel discharging transistors,
      wherein each of said transistors is connected to the single word-line,
      wherein said charging transistor and said first discharging transistor are controlled by one of said at least one control lines and said second discharging transistor is controlled by said row decoder disable line, and
      where said first discharging transistors are activatable with said second discharging transistors.

2. A row decoder according to claim 1 and wherein said first and second discharging transistors are located on opposite ends of their corresponding word-line.

3. A row decoder according to claim 1 and wherein the entirety of said second discharging transistors are connected to said row decoder disable line.

4. A row decoder according to claim 1 and also comprising discharge segmenting elements for grouping said second discharging transistors thereby to discharge only one group of said second discharging transistors at a time.

5. A row decoder according to claim 4 and wherein said discharge segmenting elements include a plurality of decoded segmenting control lines, a delay unit, per segmenting control line, for delaying the signals on said control lines and a NOR gate per segmenting control line wherein each said NOR gate is connected, on input, to the complemented output of its corresponding delay unit and to a DISABLE_B line carrying the complement of said row decoder disable line and, on output, to a group of second discharging transistors.

6. A row decoder according to claim 4 and operative for an alternate metal, virtual ground type array having a multiplicity of select control lines for segmenting the array, wherein each segment has two types of select control lines, wherein said discharge segmenting elements include, per segment:

means for determining when said select control lines have activated a corresponding segment; and means for activating the second discharging transistors of said segment only when said output of said means for determining indicates activated segment select lines and said row decoder disable line is active.

7. A row decoder according to claim 6 and wherein said means for determining includes a first NOR gate connected to said corresponding segment select lines and a delay unit for delaying the output of said first NOR gate, and said means for activating includes a second NOR gate connected, on input, to the output of said first NOR gate and a DISABLE_B line having the complement of the signal on said row decoder disable line.

8. A row decoder according to claim 7 and wherein said DISABLE_B line carries the delayed complement of the signal on said row decoder disable line.

9. A row decoder according to claim 7 and wherein said delay unit is a capacitor.

10. A row decoder according to claim 5 and wherein said DISABLE_B line carries the delayed complement of the signal on said row decoder disable line.

11. A row decoder according to claim 5 and wherein said delay units are capacitors.

* * * * *